United States Patent
Chen et al.

(10) Patent No.: US 8,519,752 B2
(45) Date of Patent: Aug. 27, 2013

(54) APPARATUS FOR REDUCING SIMULTANEOUS SWITCHING NOISE

(75) Inventors: Shih-Lun Chen, Taipei (TW); Ming-Jing Ho, Taipei (TW)

(73) Assignees: Global Unichip Corp., Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 13/477,703

(22) Filed: May 22, 2012

(65) Prior Publication Data

US 2013/0088267 A1  Apr. 11, 2013

(30) Foreign Application Priority Data

Oct. 6, 2011  (TW) .............................. 100136233 A

(51) Int. Cl.
*H03K 3/00* (2006.01)
(52) U.S. Cl.
USPC ............................ 327/111; 327/378; 327/384

(58) Field of Classification Search
USPC .......................... 327/111, 378–379, 382, 384
See application file for complete search history.

(56) References Cited

U.S. PATENT DOCUMENTS

2012/0140853 A1* 6/2012 Terauchi ...................... 375/299

* cited by examiner

*Primary Examiner* — An Luu
(74) *Attorney, Agent, or Firm* — McClure, Qualey & Rodack, LLP

(57) ABSTRACT

The invention provides an electronic device for reducing simultaneous switching noise (SSN). The electronic device includes: a driver, driving an external device according to an input signal, and including: an input end, receiving the input signal; a positive output end, coupled to an external capacitor of the external device; and a negative output end, coupled to a variable capacitor; and a loading calibration circuit, generating an adjusting signal to adjust a first capacitance of the variable capacitor so as to make the first capacitance approximately equal to a second capacitance of the external capacitor.

16 Claims, 5 Drawing Sheets

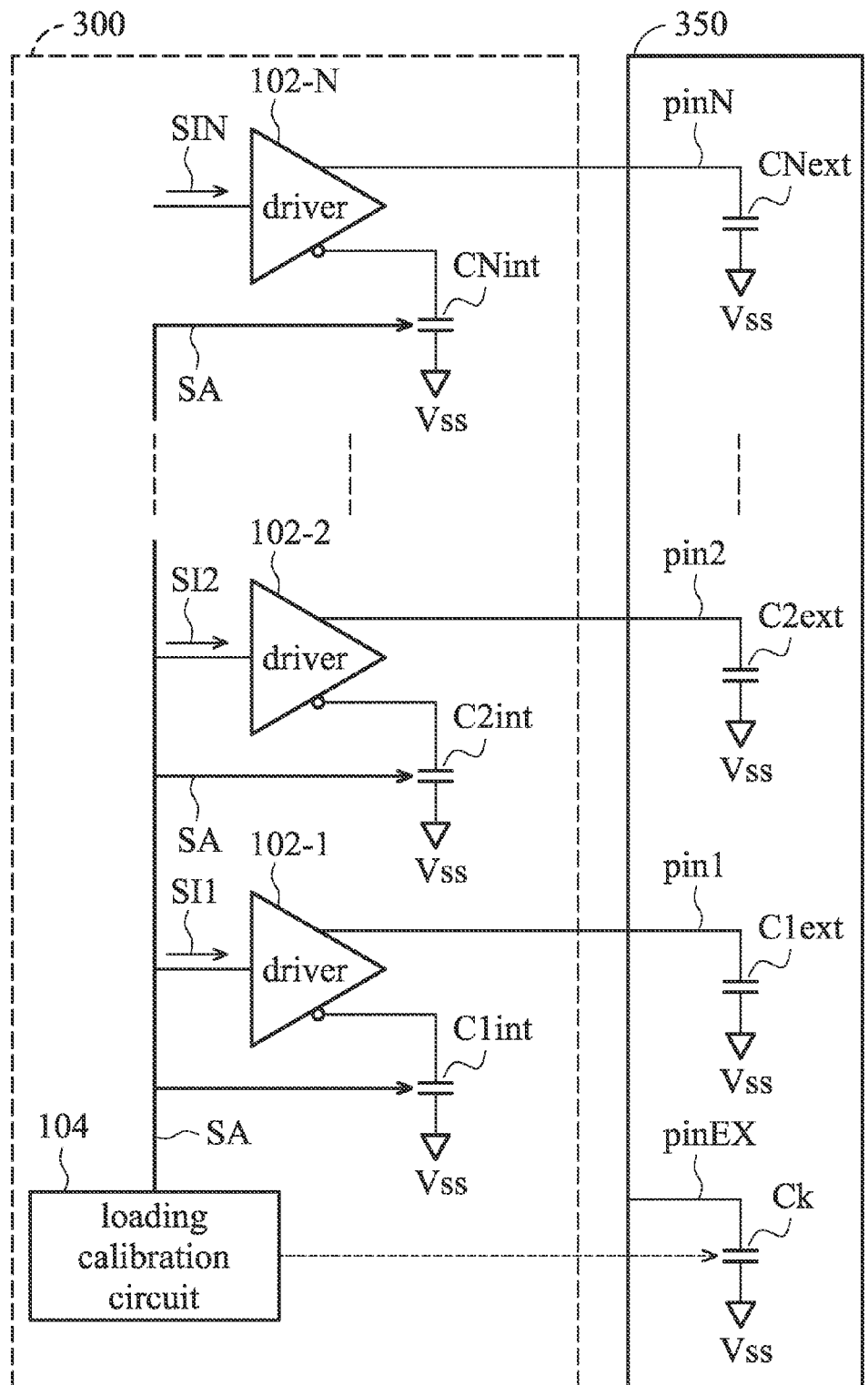
FIG. 3  $(C_k \doteq C_{1ext} \doteq C_{2ext} \doteq ... \doteq C_{Next})$

APPARATUS FOR REDUCING SIMULTANEOUS SWITCHING NOISE

CROSS REFERENCE TO RELATED APPLICATIONS

This Application claims priority of Taiwan Patent Application No. 100136233 filed on 6 Oct. 2011, the entirety of which is incorporated by reference herein.

BACKGROUND OF THE INVENTION

1. Field of the Invention

The disclosure generally relates to an electronic device, and more particularly, relates to an electronic device for reducing simultaneous switching noise (SSN).

2. Description of the Related Art

Simultaneous switching noise (SSN) is a main problem for high-speed I/O (input/output) interfaces. For example, if an output signal of a driver changes from a high voltage to a low voltage, an internal ground node of the driver will generate simultaneous switching noise due to package inductors. On the contrary, if the output signal of the driver changes from the low voltage to the high voltage, an internal power node of the driver will also generate simultaneous switching noise due to the package inductors. The foregoing reason causes an unstable output signal of the driver.

When many inputs/outputs are disposed on the same chip, simultaneous switching noise becomes more serious and causes timing uncertainty.

BRIEF SUMMARY OF THE INVENTION

For solving the foregoing problems, the invention provides an electronic device for reducing simultaneous switching noise and for improving timing uncertainty of high-speed I/O surfaces.

In one exemplary embodiment, the disclosure is directed to an electronic device for reducing simultaneous switching noise (SSN), comprising: a driver, driving an external device according to an input signal, and comprising: an input end, receiving the input signal; a positive output end, coupled to an external capacitor of the external device; and a negative output end, coupled to a variable capacitor; and a loading calibration circuit, generating an adjusting signal to adjust a first capacitance of the variable capacitor so as to make the first capacitance approximately equal to a second capacitance of the external capacitor.

In another embodiment, the disclosure is directed to an electronic device for reducing simultaneous switching noise (SSN), comprising: a plurality of drivers, driving an external device according to a plurality of input signals respectively, wherein each of the plurality of drivers comprises: an input end, receiving one of the plurality of input signals; a positive output end, coupled to one of a plurality of external capacitors of the external device; and a negative output end, coupled to one of a plurality of variable capacitors; and a loading calibration circuit, generating an adjusting signal to adjust a first capacitance of each of the plurality of variable capacitors so as to make the first capacitance approximately equal to a second capacitance of an external calibration capacitor of the external device.

BRIEF DESCRIPTION OF DRAWINGS

The invention can be more fully understood by reading the subsequent detailed description and examples with references made to the accompanying drawings, wherein:

FIG. 3 is a diagram for illustrating an electronic device according to an embodiment of the invention.

DETAILED DESCRIPTION OF THE INVENTION

Figure 1A:
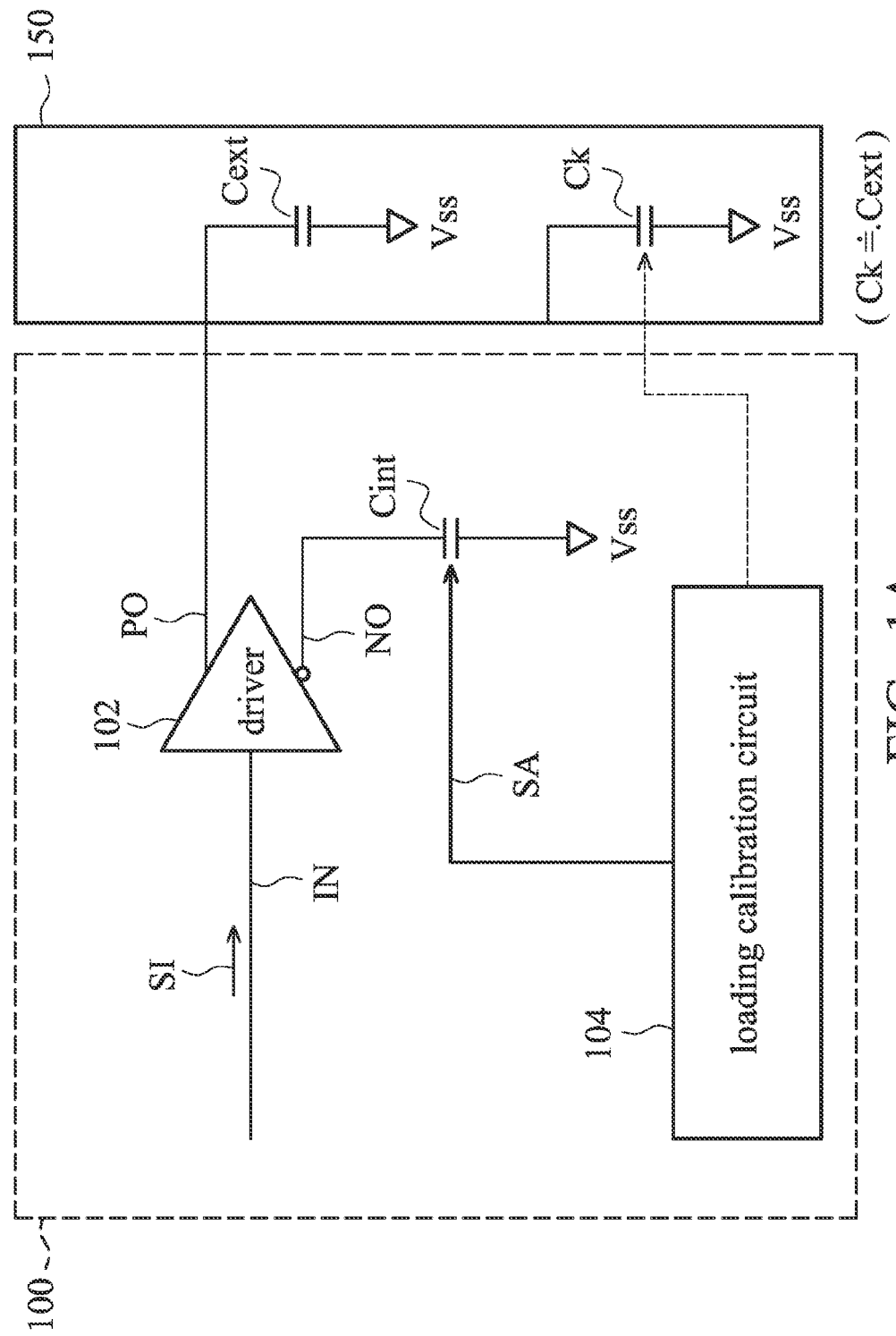
FIG. 1A is a diagram for illustrating an electronic device and an external device according to an embodiment of the invention.

FIG. 1A is a diagram for illustrating an electronic device 100 and an external device 150 according to an embodiment of the invention. As shown in FIG. 1A, the electronic device 100 comprises a driver 102 and a loading calibration circuit 104. The electronic device 100 may be a chip or a circuit device. The electronic device 100 is configured to drive the external device 150. The external device 150 may be an integrated circuit (IC) and comprises two adjacent capacitors, i.e., an external capacitor Cext and an external calibration capacitor Ck. The external capacitor Cext and the external calibration capacitor Ck may be regarded as loading effective capacitors of the external device 150, and are both electrically coupled to a ground voltage Vss. A capacitance (unit: nF) of the external capacitor Cext is approximately equal to a capacitance of the external calibration capacitor Ck.

The driver 102 may be a buffer or two coupled inverters, and it can generate a large output current. The driver 102 is configured to drive the external device 150 according to an input signal SI and comprises an input end IN, a positive output end PO and a negative output end NO, wherein the input end IN is configured to receive the input signal SI, the positive output end PO is electrically coupled to the external capacitor Cext of the external device 150, and the negative output end NO is electrically coupled to an variable capacitor Cint of the electronic device 100. It is noted that in other embodiments, the positive output end PO may be electrically coupled to the variable capacitor Cint of the electronic device 100, and the negative output end NO may be electrically coupled to the external capacitor Cext of the external device 150. The variable capacitor Cint may be a digital variable capacitor or a voltage-controlled capacitor, and it is electrically coupled to the ground voltage Vss. The loading calibration circuit 104 is configured to generate an adjusting signal SA to adjust a capacitance of the variable capacitor Cint so as to make the capacitance of the variable capacitor Cint approximately equal to the capacitance of the external capacitor Cext.

As a matter of fact, the loading calibration circuit 104 is usually configured to detect the capacitance of the external calibration capacitor Ck so as to generate the adjusting signal SA. After the adjustment, the capacitance of the variable capacitor Cint is approximately equal to the capacitance of the external calibration capacitor Ck, and also approximately equal to the capacitance of the external capacitor Cext.

Figure 1B:
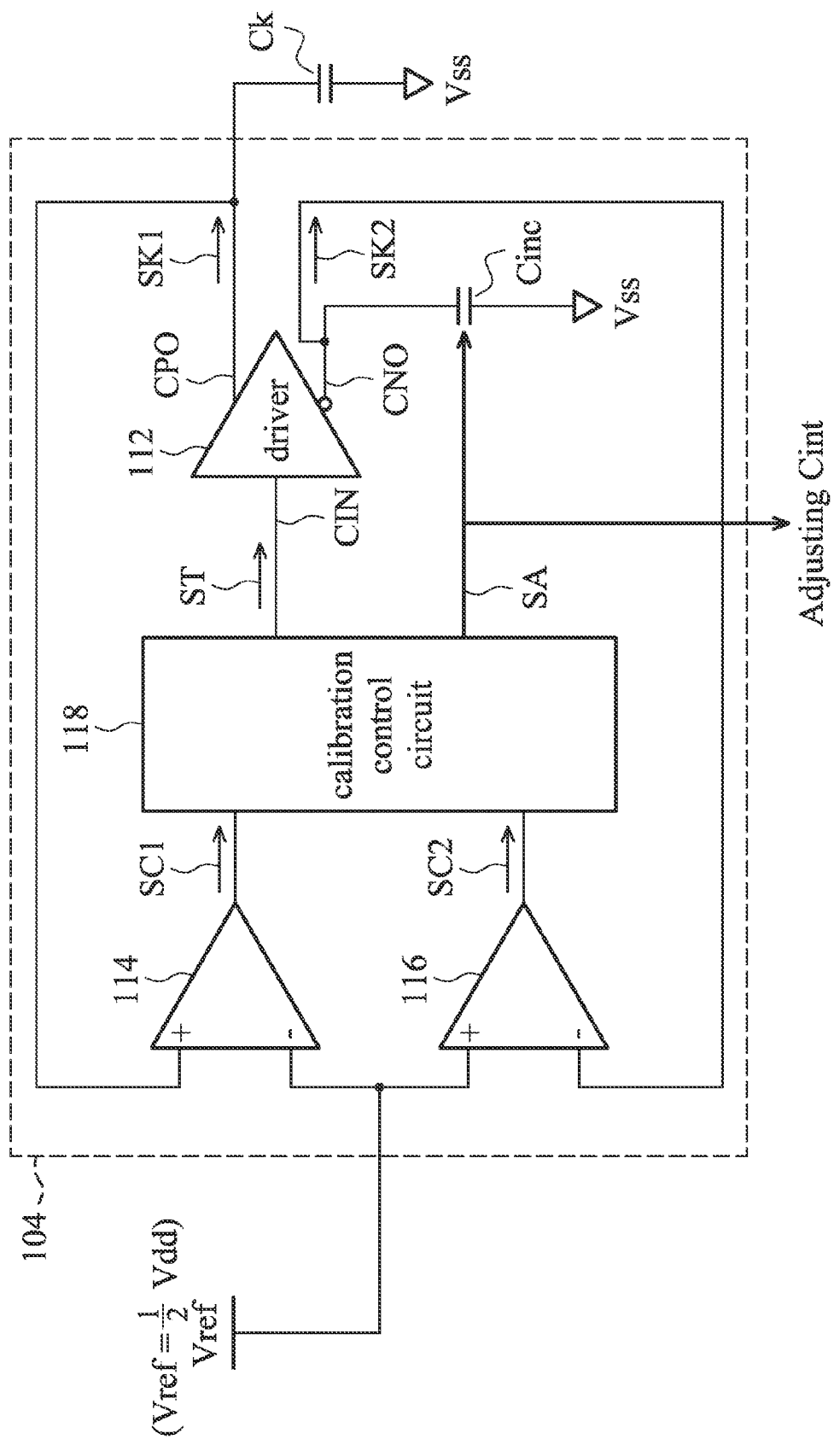
FIG. 1B is a diagram for illustrating the loading calibration circuit according to an embodiment of the invention.

FIG. 1B is a diagram for illustrating the loading calibration circuit 104 according to an embodiment of the invention. As shown in FIG. 1B, the loading calibration circuit 104 comprises a calibration driver 112, comparators 114 and 116, and a calibration control circuit 118. The calibration driver 112 may be the same as the driver 102. The calibration driver 112 is configured to generate calibration signals SK1 and SK2 according to a testing signal ST, and it comprises a calibration input end CIN, a positive calibration output end CPO and a negative calibration output end CNO, wherein the calibration input end CIN is configured to receive the testing signal ST, the positive calibration output end CPO is electrically coupled to the external calibration capacitor Ck and configured to output the calibration signal SK1, and the negative calibration output end CNO is electrically coupled to an variable calibration capacitor Cinc of the loading calibration circuit 104 and configured to output the calibration signal SK2. The variable calibration capacitor Cinc may be a digital variable capacitor or a voltage-controlled capacitor, and it is electrically coupled to the ground voltage Vss. The comparator 114 is configured to compare the calibration signal SK1, which is received by a positive input end, with a reference voltage Vref, which is received by a negative input end, so as to generate a comparison signal SC1. The comparator 116 is configured to compare the reference voltage Vref, which is received by a positive input end, with the calibration signal SK2, which is received by a negative input end, so as to generate a comparison signal SC2. The reference voltage Vref may be a half of a work voltage Vdd of the electronic device 100, i.e., Vref=0.5*Vdd.

The calibration control circuit 118 is configured to generate the testing signal ST and generate the adjusting signal SA according to the comparison signals SC1 and SC2. More particularly, the calibration control circuit 118 is configured to generate the adjusting signal SA according to voltage levels, order of the comparison signals SC1 and SC2 being received, and/or delay time which are indicated by the comparison signals SC1 and SC2. The adjusting signal SA is utilized for adjusting the capacitance of the variable capacitor Cint and a capacitance of the variable calibration capacitor Cinc so that both the foregoing capacitances are approximately equal to the capacitance of the external calibration capacitance Ck.

Figure 2A:
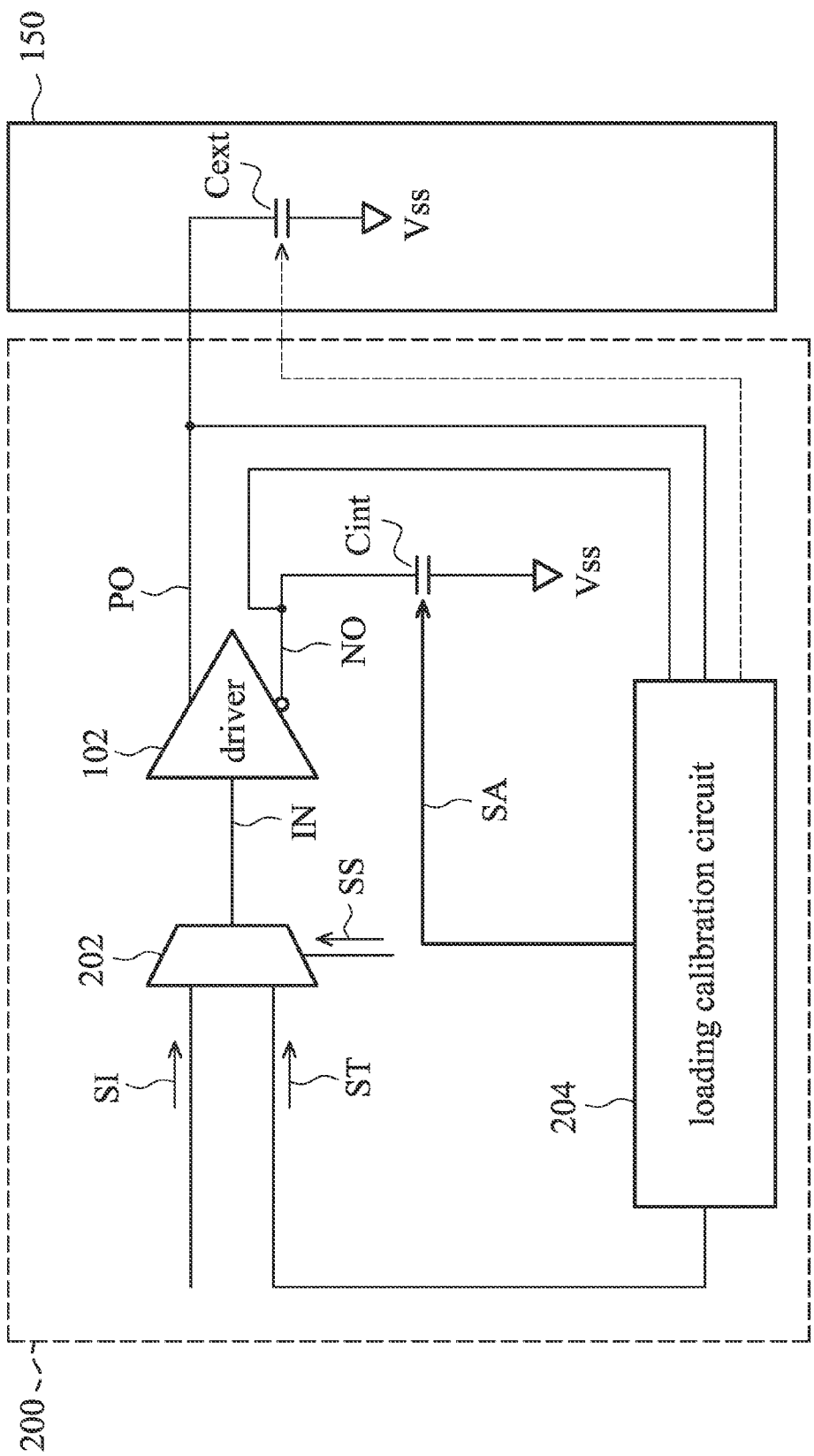
FIG. 2A is a diagram for illustrating an electronic device and an external device according to another embodiment of the invention.

FIG. 2A is a diagram for illustrating an electronic device 200 and an external device 150 according to another embodiment of the invention. The electronic device 200 is similar to the electronic device 100 as shown in FIG. 1A. The differences between them will be illustrated as follows. The electronic device 200 further comprises a multiplexer (MUX) 202 for selecting either the input signal SI or the testing signal ST generated by the loading calibration circuit 204 according to a control signal SS. More particularly, when the electronic device 200 works normally, the control signal SS causes the MUX 202 to output the input signal SI, and when the electronic device 200 calibrates itself, the control signal SS causes the MUX 202 to output the test signal ST. The driver 102 has an input end IN for receiving either the input signal SI or the testing signal ST. The loading calibration circuit 204 is further electrically coupled to the positive output end PO and the negative output end NO of the driver 102, and configured to directly detect the capacitance of the external capacitor Cext.

Figure 2B:
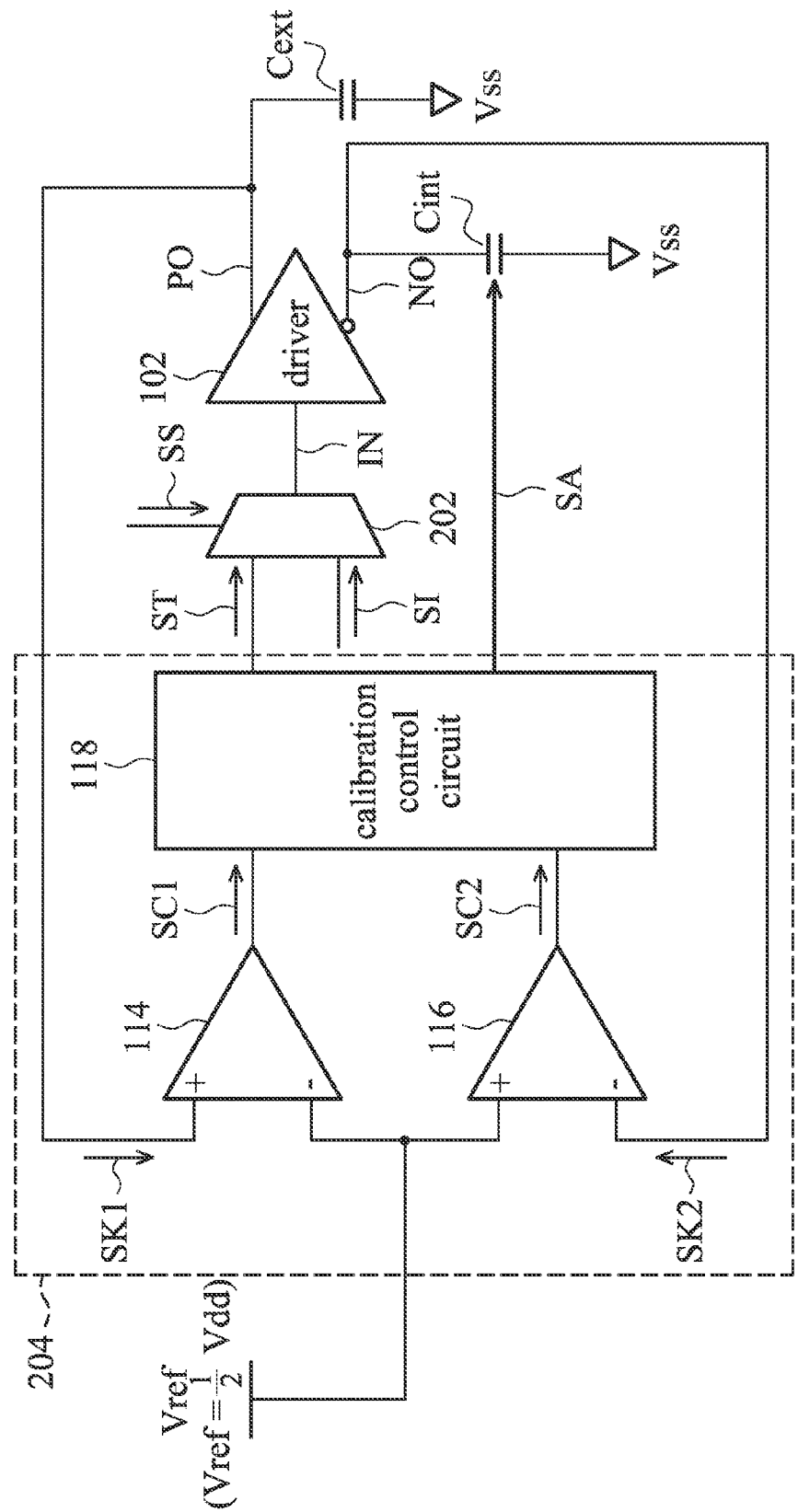
FIG. 2B is a diagram for illustrating the loading calibration circuit according to another embodiment of the invention.

FIG. 2B is a diagram for illustrating the loading calibration circuit 204 according to another embodiment of the invention. The loading calibration circuit 204 is similar to the loading calibration circuit 104 as shown in FIG. 1B. The differences between them will be illustrated as follows. The loading calibration circuit 204 includes no driver. When the electronic device 200 calibrates itself, the driver 102 is configured to generate the calibration signals SK1 and SK2 according to the testing signal ST. The loading calibration circuit 204 directly receives the reference voltage Vref and the calibration signals SK1 and SK2 so as to generate the adjusting signal SA for adjusting the capacitance of the variable capacitor Cint so as to make the capacitance of the Cint approximately equal to the capacitance of the external capacitor Cext. The other components are the same as those in FIG. 1B, and they are not illustrated again.

FIG. 3 is a diagram for illustrating an electronic device 300 according to an embodiment of the invention. As shown in FIG. 3, the electronic device 300 comprises a plurality of drivers 102-1, 102-2, ..., and 102-N and a loading calibration circuit 104, wherein N is an integer more than or equal to 2. The electronic device 300 is configured to drive an external device, i.e., an integrated circuit 350. The integrated circuit 350 comprises a plurality pins pinEX and pin1, pin2, ..., and pinN. The foregoing pins are electrically coupled to a ground voltage Vss through an external calibration capacitor Ck and external capacitors C1ext, C2ext, ..., and CNext, respectively. Because these capacitors are among the same integrated circuit, capacitances of the external capacitor C1ext, C2ext, ..., and CNext are all approximately equal to a capacitance of the external calibration capacitor Ck. The plurality of drivers 102-1, 102-2, ..., and 102-N receive a plurality of input signals SI1, SI2, ..., and SIN, respectively, and are electrically coupled to the ground voltage Vss through a plurality of variable capacitors C1int, C2int, ..., and CNint of the electronic device 300. Each of the plurality of variable capacitors C1int, C2int, ..., and CNint may be a digital variable capacitor or a voltage-controlled capacitor. The loading calibration circuit 104 is configured to detect the capacitance of the external calibration capacitor Ck so as to generate an adjusting signal SA according to the capacitance of the external calibration capacitor Ck. The adjusting signal SA is utilized for adjusting a capacitance of each of the plurality of variable capacitors C1int, C2int, ..., and CNint so as to make the capacitance approximately equal to the capacitance of the external calibration capacitor Ck and equal to a capacitance of each of the external capacitors C1ext, C2ext, ..., and CNext. Each of the plurality of drivers 102-1, 102-2, ..., 102-N is the same as the driver 102 as shown in FIG. 1A, and internal components of the loading calibration circuit 104 are shown in FIG. 1B. They are not illustrated again.

The electronic devices of the invention makes a positive input end and a negative input end of a driver have similar capacitive loads by adjusting a variable capacitor so as to reduce SSN and improve timing uncertainty of high-speed I/O interfaces. In addition, the electronic devices of the invention provide drivers with only positive (or negative) input ends coupled to an external device so as to reduce a number of pins in use and reduce a number of traces on a printed circuit board (PCB).

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. An electronic device for reducing simultaneous switching noise (SSN), comprising:
    a driver, driving an external device according to an input signal, and comprising:
        an input end, receiving the input signal;

a positive output end, coupled to an external capacitor of the external device; and a negative output end, coupled to a variable capacitor; and a loading calibration circuit, generating an adjusting signal to adjust a first capacitance of the variable capacitor so as to make the first capacitance approximately equal to a second capacitance of the external capacitor.

2. The electronic device as claimed in claim 1, wherein the loading calibration circuit is configured to detect a third capacitance of an external calibration capacitor of the external device and generate the adjusting signal according to the third capacitance.

3. The electronic device as claimed in claim 2, wherein the third capacitance of the external calibration capacitor is approximately equal to the second capacitance of the external capacitor.

4. The electronic device as claimed in claim 2, wherein the loading calibration circuit comprises:

a calibration driver, generating first and second calibration signals according to a testing signal, and comprising:
a calibration input end, receiving the testing signal;
a positive calibration output end, coupled to the external calibration capacitor, and outputting the first calibration signal; and
a negative calibration output end, coupled to a variable calibration capacitor, and outputting the second calibration signal;

a first comparator, comparing a reference voltage with the first calibration signal so as to generate a first comparison signal;

a second comparator, comparing the reference voltage with the second calibration signal so as to generate a second comparison signal; and a calibration control circuit, generating the testing signal, and generating the adjusting signal according to the first and second comparison signals.

5. The electronic device as claimed in claim 4, wherein the reference voltage is a half of a work voltage of the electronic device.

6. The electronic device as claimed in claim 4, wherein the calibration control circuit is configured to generate the adjusting signal according to voltage levels, order of the first and second comparison signals being received, or delay time which are indicated by the first and second comparison signals.

7. The electronic device as claimed in claim 1, wherein the variable capacitor is a digital variable capacitor.

8. The electronic device as claimed in claim 1, wherein the external device is an integrated circuit (IC).

9. An electronic device for reducing simultaneous switching noise (SSN), comprising:

a plurality of drivers, driving an external device according to a plurality of input signals respectively, wherein each of the plurality of drivers comprises:

an input end, receiving one of the plurality of input signals;

a positive output end, coupled to one of a plurality of external capacitors of the external device; and a negative output end, coupled to one of a plurality of variable capacitors; and a loading calibration circuit, generating an adjusting signal to adjust a first capacitance of each of the plurality of variable capacitors so as to make the first capacitance approximately equal to a second capacitance of an external calibration capacitor of the external device.

10. The electronic device as claimed in claim 9, wherein the loading calibration circuit is configured to detect the second capacitance of the external calibration capacitor and generate the adjusting signal according to the second capacitance.

11. The electronic device as claimed in claim 10, wherein each of the plurality of external capacitors has a third capacitance, and the second capacitance is approximately equal to the third capacitance.

12. The electronic device as claimed in claim 10, wherein the loading calibration circuit comprises:

a calibration driver, generating first and second calibration signals according to a testing signal, and comprising:
a calibration input end, receiving the testing signal;
a positive calibration output end, coupled to the external calibration capacitor, and outputting the first calibration signal; and
a negative calibration output end, coupled to a variable calibration capacitor, and outputting the second calibration signal;

a first comparator, comparing a reference voltage with the first calibration signal so as to generate a first comparison signal;

a second comparator, comparing the reference voltage with the second calibration signal so as to generate a second comparison signal; and a calibration control circuit, generating the testing signal, and generating the adjusting signal according to the first and second comparison signals.

13. The electronic device as claimed in claim 12, wherein the reference voltage is a half of a work voltage of the electronic device.

14. The electronic device as claimed in claim 12, wherein the calibration control circuit is configured to generate the adjusting signal according to voltage levels, order of the first and second comparison signals being received, or delay time which are indicated by the first and second comparison signals.

15. The electronic device as claimed in claim 9, wherein the variable capacitor is a digital variable capacitor.

16. The electronic device as claimed in claim 9, wherein the external device is an integrated circuit (IC).

* * * * *